(12) United States Patent
Wagner

(10) Patent No.: US 7,732,104 B2
(45) Date of Patent: Jun. 8, 2010

(54) SYSTEM AND METHOD FOR ELIMINATING THE STRUCTURE AND EDGE ROUGHNESS PRODUCED DURING LASER ABLATION OF A MATERIAL

(75) Inventor: Alfred Wagner, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 619 days.

(21) Appl. No.: 11/624,257

(22) Filed: Jan. 18, 2007

(65) Prior Publication Data

US 2008/0176147 A1    Jul. 24, 2008

(51) Int. Cl.
G03F 1/00     (2006.01)
B23K 26/00    (2006.01)

(52) U.S. Cl. .................................. 430/5; 219/121.68

(58) Field of Classification Search .............. 430/5, 430/30; 219/121.68, 121.69; 359/485
See application file for complete search history.

(56) References Cited

U.S. PATENT DOCUMENTS

| | | | |
|---|---|---|---|
| 5,057,664 A * | 10/1991 | Johnson et al. | ........ 219/121.69 |
| 6,090,507 A | 7/2000 | Grenon et al. | |
| 6,120,725 A * | 9/2000 | Asahi et al. | .................. 264/400 |
| 6,156,461 A | 12/2000 | Grenon et al. | |
| 6,165,649 A | 12/2000 | Grenon et al. | |
| 6,190,836 B1 | 2/2001 | Grenon et al. | |
| 6,333,485 B1 | 12/2001 | Haight et al. | |

OTHER PUBLICATIONS

"Laser Induced Periodic Surface Structure: Experiments on Ge, Si, Al, and Brass", Young, Preston, vsn Driel, and Sipe, Physical Review B, vol. 27, No. 2, pp. 1155-1172 (1983).
"Ultraviolet Laser Induced Periodic Surface Structures", Clark and Emmony, Physical Review B, vol. 40, No. 4, pp. 2031-2041 (1989).
"Femtosecond Laser Induced Periodic Surface Structure on Diamond Film", Wu, Ma, Fang, Liao, Yu, Chen, Wang, Applied Physics Letters, vol. 82, No. 11, pp. 1703-1705 (2003); and.
"Self Organixed Nanogratings in Glass Irradiated by Ultrashort Light Pulses", Shimotsuma, Kazansky, Qui, Hirao, Physical Review Letters, vol. 19, No. 24, pp. 247205-1 to 4 (2003).

* cited by examiner

Primary Examiner—Stephen Rosasco
(74) Attorney, Agent, or Firm—Scully, Scott, Murphy & Presser, P.C.; Daniel P. Morris, Esq.

(57) ABSTRACT

The present technology relates generally to laser ablation, and more particularly pertains to a system and method for eliminating structure and edge roughness, which is produced during the laser ablation of a material. Ablation of materials using a femtosecond laser beam produces a fine scale periodic structure in the ablated region. The structure consists of residual (i.e. unablated material) and is always perpendicular to the polarization direction of the laser beam. By changing the polarization direction during the ablation process, the structure is averaged over many directions and thus eliminated. This eliminates structure and edge roughness in a material caused by the laser ablation of the material. The method is employed to the repairing of photomasks so as to cause the optical quality thereof to be improved.

4 Claims, 2 Drawing Sheets

SYSTEM AND METHOD FOR ELIMINATING THE STRUCTURE AND EDGE ROUGHNESS PRODUCED DURING LASER ABLATION OF A MATERIAL

BACKGROUND OF THE INVENTION

1. Field of the Invention

The present invention relates generally to laser ablation, and more particularly pertains to a system and method for eliminating structure and edge roughness, which is produced during the laser ablation of a material.

Typically, in this particular technology, an ultrashort pulsed laser beam is utilized to ablate undesired extra material, which is present in a photomask. The pulsed laser beam is fired in a programmed spatial pattern, thereby removing the encountered extra material which causes a defect. However, it is possible that the process of laser ablation can produce a periodic structure in the irradiated material, whereby this periodic structure produces a significant roughness at the edge of the ablated defect, which degrades the optical quality of the repaired photomask. Consequently, there is a need to provide a system and method which will prevent or eliminate this edge roughness, and thereby to resultingly produce a repaired photomask with improved optical quality.

2. Discussion of the Prior Art

In the current state-of-the-technology, a number of publications are known which disclose and teach the application of equipment and methods, which are required in order to remove defects encountered in lithographic masks. To that effect, an ulstrashort pulsed laser beam may be utilized to ablate undesired extra material in a programmed spatial pattern, thereby removing the encountered defects. The foregoing aspects are disclosed in Grenon, et al., U.S. Pat. Nos. 6,190,836; 6,165,649; 6,156,461; 6,090,507; and Haight, et al., U.S. Pat. No. 6,333,485.

Furthermore, as known, laser ablation can produce a periodic structure in the irradiated material, thereby resulting in a significant degree of roughness at the edge of the ablated defect, which degrades the optical quality of the repaired photomask. This aspect is discussed in various publications, such as, for instance, the following articles: "Laser Induced Periodic Surface Structure: Experiments on Ge, Si, Al, and Brass", Young, Preston, vsn Driel, and Sipe, Physical Review B, Vol. 27, No. 2, pgs. 1155-1172 (1983); "Ultraviolet Laser Induced Periodic Surface Structures", Clark and Emmony, Physical Review B, Vol. 40, No. 4, pgs 2031-2041 (1989); "Femtosecond Laser Induced Periodic Surface Structure on Diamond Film", Wu, Ma, Fang, Liao, Yu, Chen, Wang, Applied Physics Letters, Vol. 82, No. 11, pgs 1703-1705 (2003); and "Self Organixed Nanogratings in Glass Irradiated by Ultrashort Light Pulses", Shimotsuma, Kazansky, Qui, Hirao, Physical Review Letters, Vol. 19, No. 24, pgs 247205-1 to 4 (2003).

SUMMARY OF THE INVENTION

Ablation of materials using a femtosecond laser beam produces a fine scale periodic structure in the ablated region. The structure consists of residual (i.e. unablated material) and is always perpendicular to the polarization direction of the laser beam. By changing the polarization direction during the ablation process, the structure is averaged over many directions and thus any undue edge roughness or structure is eliminated.

Accordingly, it is an object of the present invention to provide a method of eliminating structure and edge roughness in a material caused by the laser ablation of the material.

Another object of the invention resides in imparting the method as described in an application to the repairing of photomasks so as to cause the optical quality thereof to be improved.

Yet another object is to provide a system of eliminating structure and edge roughness imparted to a material, such as a photomask, during laser ablation of the material.

The foregoing and other objects, aspects, features, and advantages of the invention will become more readily apparent from the following description and from the claims.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention; wherein.

DETAILED DESCRIPTION OF THE INVENTION

Defects are commonly encountered during the fabrication of a photomask, whereby these defects generally consist of extra (unwanted) material that must be removed in order to create a perfect photomask. Femtosecond lasers can be used to ablate this extra material, thus removing the defect. Hereby, the placement and spatial sharpness of the edge of the repaired region is critical to producing a high quality photomask. Anything that detracts from the placement and spatial sharpness of the repaired edge must be avoided.

Figure 1:
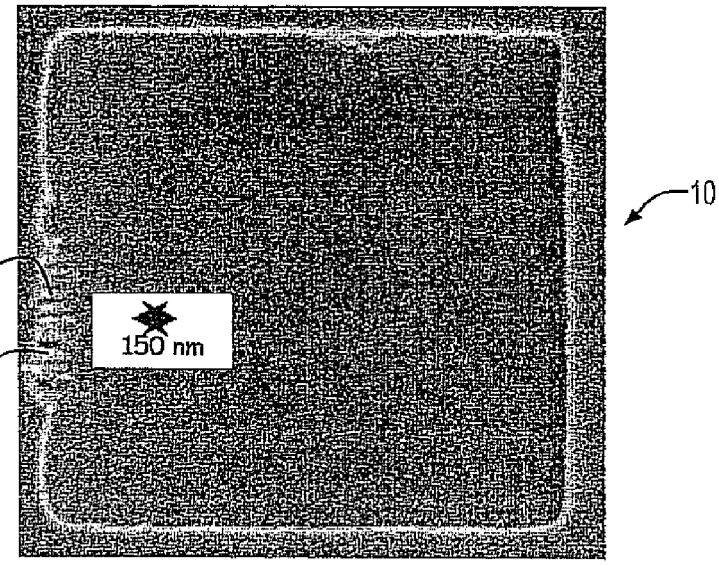
FIG. 1 is an illustrative picture of a repaired photomask in which a defect was removed by femtosecond laser ablation.

Referring to FIG. 1, there is represented a picture of a repaired photomask 10 in which a defect was removed by femtosecond laser ablation of a repair site 12. Laser ablation typically produces a highly periodic structure 14, which degrades the optical quality of the repaired edge 16. This periodic structure 14 can be traced to the polarization of the laser beam, which is used to ablate the material.

Figure 2:
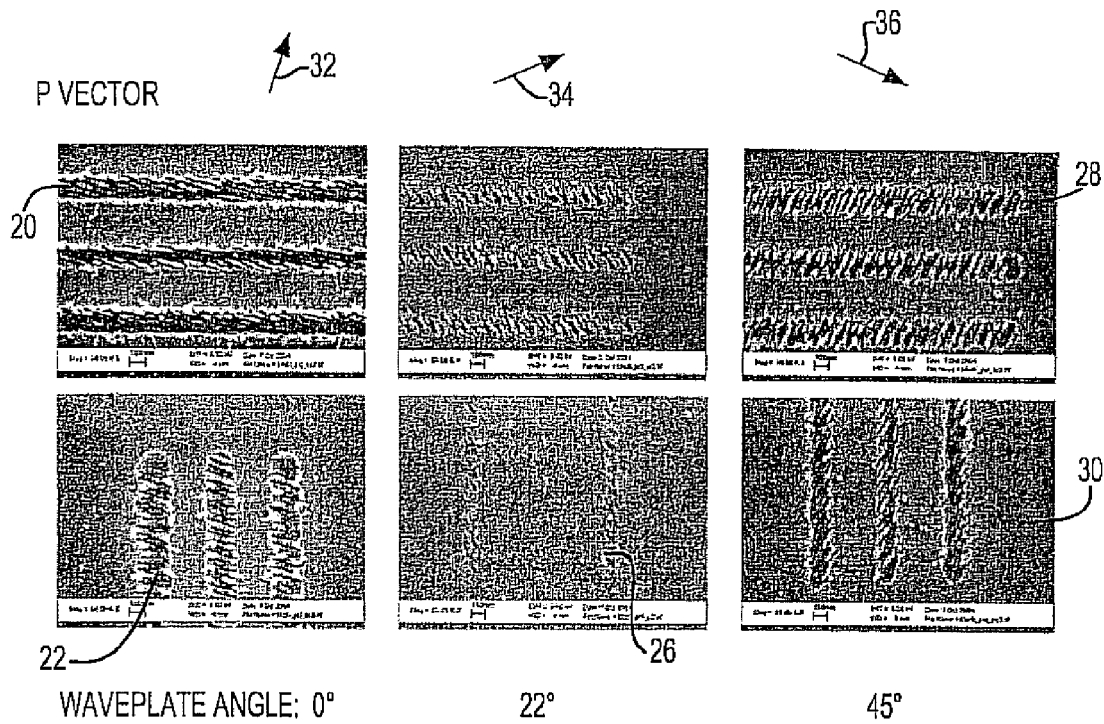
FIG. 2 shows illustrative pictures of periodic structures in ablated lines as a function of the direction of polarization of the femtosecond laser beam.

Referring to FIG. 2, there are illustrated images of periodic structures 20, 22, 24, 26, 28 and 30 formed in an ablated line as a function of the direction of polarization 32, 34 and 36 of the femtosecond laser beam. These periodic structures 20, 22, 24, 26, 28 and 30 are always oriented perpendicular to the polarization direction 32, 34 and 36 of the laser beam. If multiple polarization direction are used during the ablation sequence, the resulting structure consist of an average of these direction of the periodic structure formed by any individual polarization direction. Thus by performing the ablation using a series of polarization directions, the periodic structure is minimized or eliminated by means of averaging.

Figure 3:
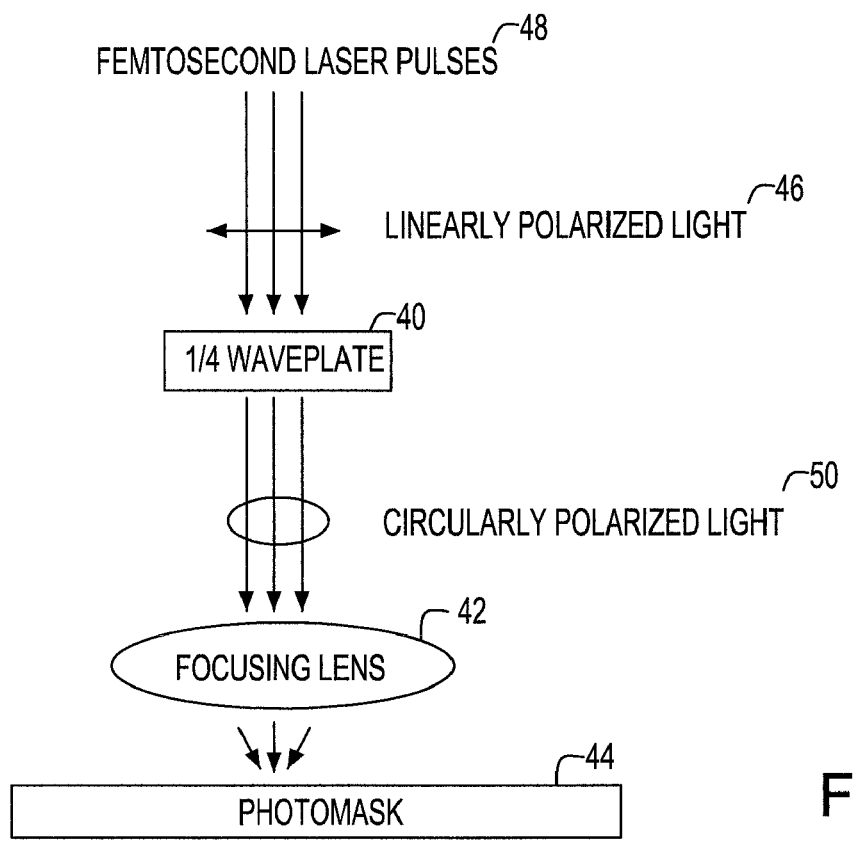
FIG. 3 is an illustrative block diagram of a system for rotating the polarization of a laser beam to average the direction of the ablation structure, and thereby eliminate it, according to one embodiment of the invention.

Referring to FIG. 3, there is shown a block diagram of a system for rotating the polarization of a laser beam to average the direction of the ablation structure, and thereby any periodic structure and resultant roughness is eliminated. The system includes a ¼ waveplate 40, a focusing lens 42, and a photomask 44. Linearly polarized light 46, which is pulsed from a femtolaser 48 passes through the ¼ waveplate 40 and is turned into circularly (or eliptically) polarized light 50. The circularly polarized light 50 passes through the focusing lens 42 and is incident on the photomask 44. In this case, the polarization direction of the incident laser light would continuously change direction during each laser pulse. By way of example, for 100 femtosecond, 266 nm laser pulses, which are employed for mask repair, the polarization direction would rotate a full 360 degrees through approximately one hundred times, thus averaging the periodic structure over all directions many times.

Since ablation occurs only over the portion of each laser pulse in which the laser amplitude exceeds the threshold for ablation, the effective number of polarization direction cycles will be considerably less than one hundred. At the limit which only the peak of the laser pulse ablates material (a situation which results in the highest spatial resolution), the effective polarization direction would be nearly identical for each laser if the amplitude of each laser pulse was nearly identical. This is undesirable since it reduces the amount of averaging over each polarization direction. Therefore, it is also advantageous if there is some pulse to pulse variation in the amplitude of laser pulses, and if multiple laser pulses overlap spatially. This variation will help to randomize the polarization directions from one laser pulse to the next.

Figure 4:
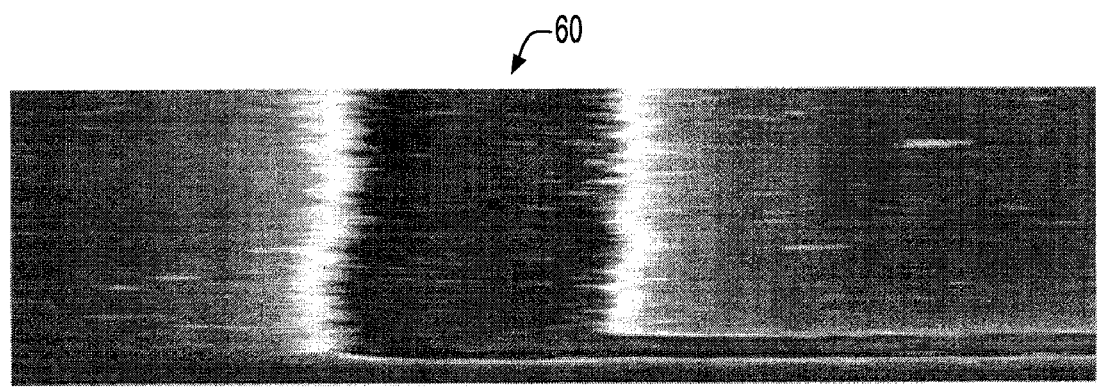
FIG. 4 is an illustrative picture of a line of ablated material in which the edge roughness (ablation structure) has been eliminated, according to one embodiment of the invention.

Referring to FIG. 4, there is illustrated an image of a line of ablated material 60 in which the edge roughness (ablation structure) has been eliminated. In this case, a quarter wave plate was inserted into the laser path just prior to the laser beam entering the final focusing lens. There was approximately a 5% pulse to pulse variation in the amplitude of each laser pulse. The resulting ablation does not evidence any of periodic structure, and thus the edges of the ablated region are very smooth.

An alternative method of averaging over many polarization directions involves a rotating half wave plate. By mechanically rotating a half wave plate during an ablation, the polarization direction also rotates, thus averaging the periodic ablation structure. For example, the repaired region could be scanned repeatedly with the half wave plate rotated by 90 degrees between each scan. This would produce an average of two periodic structures oriented at 90 degrees to each other.

Another method of averaging over many polarization directions involves inserting a Pockell Cell in the path of the laser beam. By applying a voltage to the Pockell Cell, the polarization direction can be rotated to any desired angle. If the applied voltage is varied as the laser beam is scanned, averaging over any desired number of polarization directions can be achieved.

Variations, modifications, and other implementations of what is described herein may occur to those of ordinary skill in the art without departing from the spirit and scope of the invention. Accordingly, the invention is not to be defined only by the preceding illustrative description.

What is claimed is:

1. A method of reducing periodic structure formed in a photomask material during a laser ablation process, the method comprising:

converting incident linearly polarized laser light pulsed from a laser into circularly or eliptically polarized laser light;

altering the polarization direction of the linearly polarized laser light that is converted to the circularly or eliptically polarized laser light and is incident on the photomask material during each pulse of the laser;

irradiating the photomask material with the focused incident circularly or eliptically polarized laser light;

averaging a plurality of polarization directions effected during the ablation process; and wherein the polarizing and averaging are implemented by inserting a quarter wave plate into an optical path of the linear pulsed laser light to produce the circularly or eliptically polarized light during the laser ablation process.

2. The method according to claim 1, wherein the averaging is performed by rotating the half wave plate during the laser ablation process.

3. The method as claimed in claim 1, wherein the polarization direction is altered by inserting a Pockell Cell into the optical path of the laser light.

4. The method as claimed in claim 3, wherein the averaging is performed by applying a varying voltage to the Pockell Cell during the laser ablation process.

* * * * *